(12) United States Patent
Chen

(10) Patent No.: US 6,777,260 B1
(45) Date of Patent: Aug. 17, 2004

(54) METHOD OF MAKING SUB-LITHOGRAPHIC SIZED CONTACT HOLES

(75) Inventor: Bomy Chen, Cupertino, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/641,490

(22) Filed: Aug. 14, 2003

(51) Int. Cl.[7] .............................................. H01L 21/06
(52) U.S. Cl. ........................... 438/95; 438/94; 438/96; 438/97; 438/98; 438/666; 438/667; 257/2; 257/3; 257/4; 257/5
(58) Field of Search ............................. 438/94, 95, 96, 438/97, 98, 666, 667; 257/2, 3, 4, 5

(56) References Cited

U.S. PATENT DOCUMENTS

| | | | | |
|---|---|---|---|---|
| 5,395,797 A | * | 3/1995 | Chen et al. .................. | 438/467 |
| 5,468,652 A | * | 11/1995 | Gee .............................. | 438/98 |
| 5,759,911 A | * | 6/1998 | Cronin et al. ............... | 438/622 |
| 6,228,747 B1 | * | 5/2001 | Joyner ......................... | 438/436 |
| 6,229,169 B1 | * | 5/2001 | Hofmann et al. ........... | 257/296 |
| 6,461,888 B1 | * | 10/2002 | Sridhar et al. .............. | 438/52 |
| 6,511,862 B2 | | 1/2003 | Hudgens et al. | |
| 6,514,805 B2 | | 2/2003 | Xu et al. | |
| 2002/0119592 A1 | * | 8/2002 | Oswald et al. .............. | 438/96 |
| 2003/0221718 A1 | * | 12/2003 | Kubo et al. ................. | 136/256 |
| 2004/0042329 A1 | * | 3/2004 | Dennison .................... | 365/232 |

* cited by examiner

*Primary Examiner*—Matthew Smith
*Assistant Examiner*—Victor V Yevsikov
(74) *Attorney, Agent, or Firm*—Gray Cary Ware & Freidenrich LLP

(57) ABSTRACT

A method of forming sub-lithographic sized contact holes in semiconductor material, which includes forming layers of etch mask materials, and forming intersecting first and second trenches in the etch mask layers, where through-holes are formed completely through the etch mask layers only where the first and second trenches intersect. The first and second trenches are made by the formation and subsequent removal of very thin vertical layers of material. The width dimensions of the trenches, and therefore of the through-holes, are sub-lithographic because they are dictated by the thickness of the thin vertical layers of material, and not by conventional photo lithographic processes used to form those vertical layers of material. The sub-lithographic through-holes are then used to etch sub-lithographic sized contact holes in underlying semiconductor materials.

38 Claims, 14 Drawing Sheets

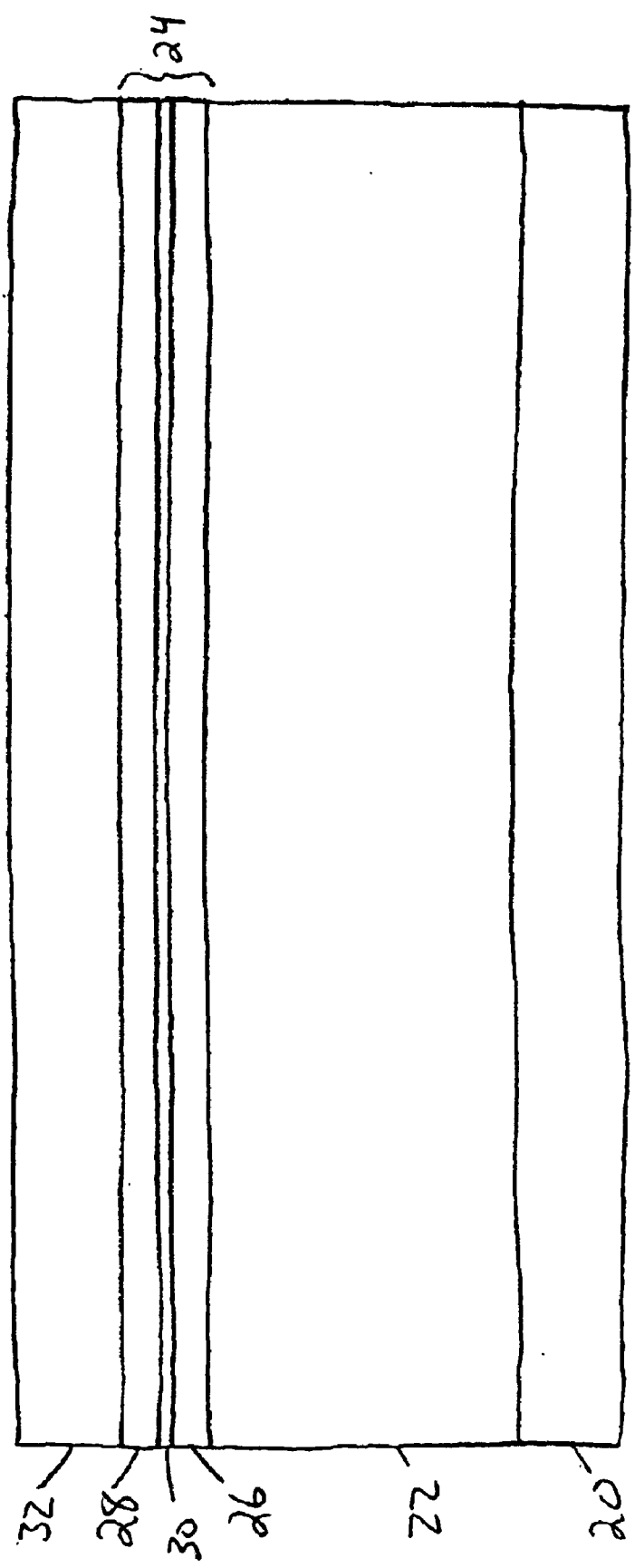

METHOD OF MAKING SUB-LITHOGRAPHIC SIZED CONTACT HOLES

FIELD OF THE INVENTION

The present invention relates to semiconductor processing, and more particularly to the formation of sub-lithographic sized contact holes in which electrical devices are formed.

BACKGROUND OF THE INVENTION

In the fabrication/manufacture of devices on a semiconductor substrate, such as certain circuits or memory devices, it is often desirable to form extremely small contact holes in which such circuits or memory devices are formed. For example, phase change memory devices have been known for some time. These devices use materials that can be electrically switched (programmed) between different structured states that exhibit different electrical read-out properties. One such phase change memory material is chalcogenide, which is programmable between a generally amorphous state (that exhibits a relatively high resistivity) and a generally crystalline state (that exhibits a relatively low resistivity). The chalcogenide material is programmed by heating the material, whereby the amplitude and duration of the heating dictates whether the chalcogenide is left in an amorphous or crystallized state. The high and low resistivities represent programmed "1" and "0" values, which can be sensed by then measuring the resistivity of the chalcogenide material.

FIG. 1A illustrates a memory cell employing chalcogenide phase change memory material. The memory cell includes a layer of chalcogenide 2 disposed between a pair of electrodes 4/6, which are surrounded by thermal and electrical insulator material 8. One of the electrodes (in this case the lower electrode 4) has an increased resistivity making it a thermal heater that heats the chalcogenide layer 2 when an electrical current is passed through the electrodes 4/6 (and through the chalcogenide layer 2). FIG. 1A, for example, shows the chalcogenide 2 in its crystallized form in which the material is highly conductive, and provides a low resistance between electrodes 4/6. When heated by electrode 4 by an amorphousizing thermal pulse (short thermal pulse with rapid cooling so chalcogenide material amorphousizes without time to crystallize), at least a portion 10 of the chalcogenide layer 2 is amorphousized, as shown in FIG. 1B, which increases the electrical resistance of the chalcogenide material. The chalcogenide 2 can by crystallized back to its lower electrical resistance state by applying a crystallization thermal pulse (longer thermal pulse that allows chalcogenide to crystallize). The electrical resistance of this memory cell can be read using a small electrical current that does not generate enough heat to reprogram the chalcogenide material.

There is a constant need to shrink down the size of the memory cells. The power needed to program such memory cells is generally proportional to the cross-sectional area and volume of the memory material being amorphousized/crystallized. Thus, reducing the size and volume of the memory material used in each cell reduces the electrical current and power consumption of the memory device. Smaller sized memory cells also reduces the overall size of memory cell arrays, and provides more space between memory cells for greater thermal isolation.

Phase change memory devices are typically made using conventional photo lithography processing, whereby photo resistant masking material is disposed over one or more layers of insulation material. A masking step is performed to selectively remove the photo resistant masking material from certain regions (i.e. hole locations) of the insulation material, which are left exposed. An etch process follows, which etches away the exposed portions of the insulation material, forming contact holes therein. The programmable memory material and usually one or both electrodes are formed in the contact holes. Therefore, the size of the contact holes dictates the size and volume of the memory material used by the memory cells.

In order to minimize memory cell size, and achieve the advantages of reducing the size and volume of programmed memory material, it is imperative to maximize the resolution of the photo lithography process being used to make such memory cells. Unfortunately, conventional photo lithography techniques simply do not have a resolution that has been scaling down fast enough to reliably produce contact holes of the desired size. Holes in photo resist masking material can simply be made only so small.

One solution has been to form spacers inside the holes before the memory material blocks are formed, which effectively reduces the width dimensions of the contact holes (see for example U.S. Pat. No. 6,511,862). However, as the desired contact hole widths become extremely small (i.e. on the order of 10 nm), it can be difficult to control spacer formation to precisely and repeatedly form contact holes of the desired size.

There is a need for a technique to form sub-lithographic sized contact holes that have smaller dimensions than that producible by conventional photo lithographic processes.

SUMMARY OF THE INVENTION

The present invention is a method for forming a contact hole in a semiconductor device by forming a first material over a substantially horizontal surface of a semiconductor substrate, forming an etch mask over the first material where the etch mask includes at least a first trench and a second trench formed therein and where a through-hole extends entirely through the etch mask where the first and second trenches intersect each other and exposes an area of the first material, and performing an etch process on the exposed area of the first material via the through-hole to form a contact hole in the first material.

In another aspect of the present invention, the method includes forming a first material over a substantially horizontal surface of a semiconductor substrate, forming an etch mask over the first material where the etch mask includes a plurality of first trenches and a plurality of second trenches formed therein and where through-holes extend entirely through the etch mask where the first trenches intersect with the second trenches and expose areas of the first material, and performing an etch process on the exposed areas of the first material via the through-holes to form contact holes in the first material.

Other objects and features of the present invention will become apparent by a review of the specification, claims and appended FIGURES.

BRIEF DESCRIPTION OF THE DRAWINGS

FIGS. 2A to 2E are cross-sectional views illustrating the process of forming the etch mask and contact holes of the present invention.

DETAILED DESCRIPTION OF THE PREFERRED EMBODIMENTS

The present invention is an improved technique for forming an array of sub-lithographic sized contact holes. The invention includes the formation of an etch mask in which intersecting sub-lithographic sized trenches are formed. Sub-lithographic sized through-holes are formed through the etch mask (exposing the underlying material) only where the trenches intersect. The masking through holes are then used to etch sub-lithographic sized contact holes into the underlying material.

Figure 1A:
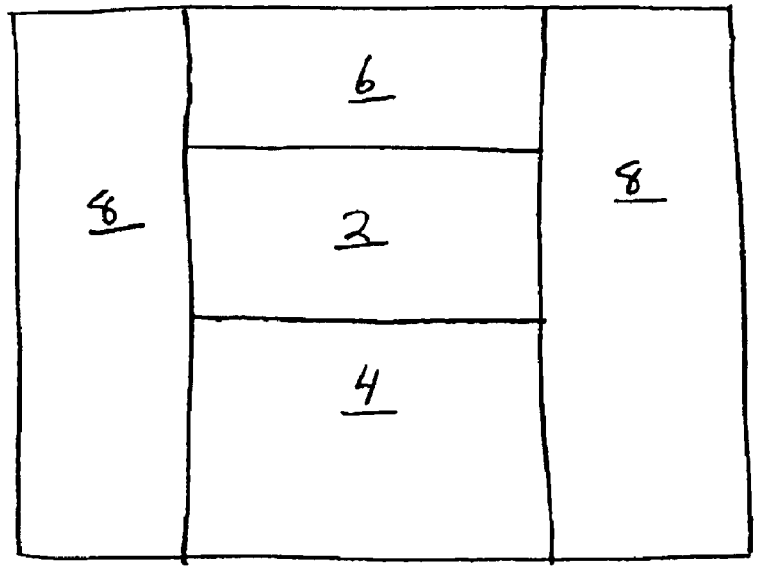
FIG. 1A is a cross-sectional view of a conventional phase change memory device.
Figure 1B:
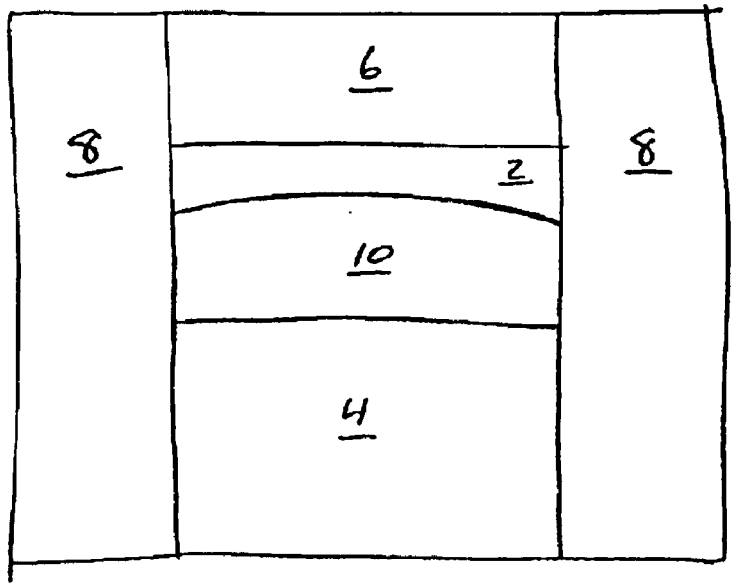
FIG. 1B is a cross-sectional view of the conventional phase change memory device, after undergoing an amorphousizing thermal pulse.
Figure 2B:
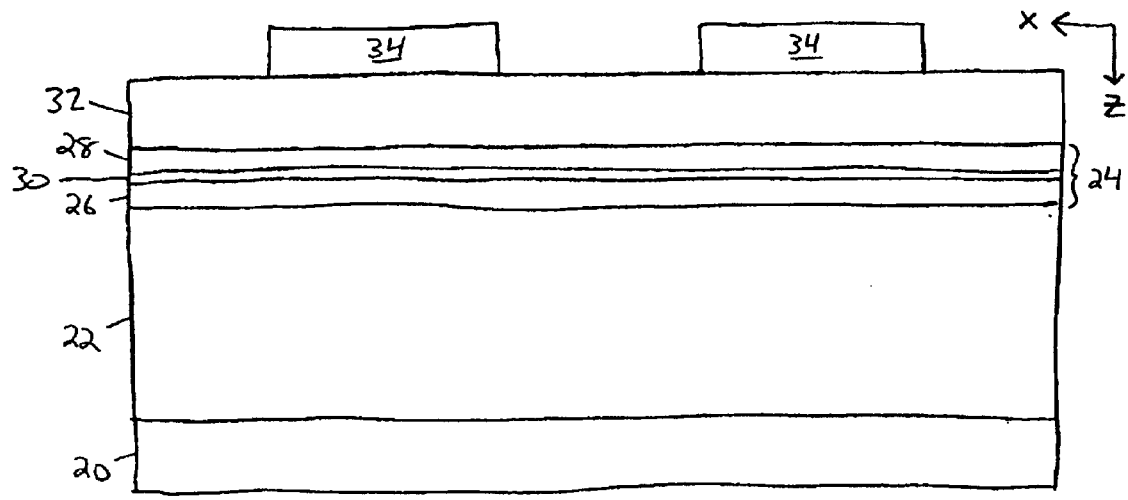

FIGS. 2A–2E and 3 illustrate the initial steps in forming the sub-lithographic sized contact holes using the etch mask of the present invention. The process begins by forming a plurality of material layers over a substrate 20, as illustrated in FIG. 2A. Specifically, a thick layer of insulation material 22 (e.g. 2000 Å thickness of interlayer dielectric—ILD) is formed over the substrate 20 using standard deposition techniques such as chemical vapor deposition (CVD). An etch mask 24 is then formed over ILD layer 22, and includes lower and upper etch mask material layers 26 and 28 respectively, separated by an intermediate (etch stop) etch mask layer 30 of material having high selective etch properties relative to the upper etch mask layer 28. An exemplary etch mask is formed as follows. Lower etch mask layer 26 is made of amorphous silicon that is formed on ILD layer 22, with a thickness of about 100 Å. The top surface of lower etch mask layer 26 is then oxidized (e.g. via plasma oxidation) to form silicon dioxide ("oxide") as the intermediate etch mask layer 30 (e.g. 10 to 30 Å in thickness). Finally, upper etch mask layer 28 (e.g. amorphous silicon having 100 Å thickness) is formed over intermediate etch mask layer 30. To complete the structure shown in FIG. 2A, a layer of material 32 (e.g. silicon nitride—"nitride"—having a thickness of about 600 Å) is formed over upper etch mask layer 28 using standard deposition techniques (e.g. CVD).

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed therebetween). For example, forming an element "over a substrate" can include forming the element directly on the substrate with no intermediate materials/elements therebetween, as well as forming the element indirectly on the substrate with one or more intermediate materials/elements therebetween.

Figure 2C:
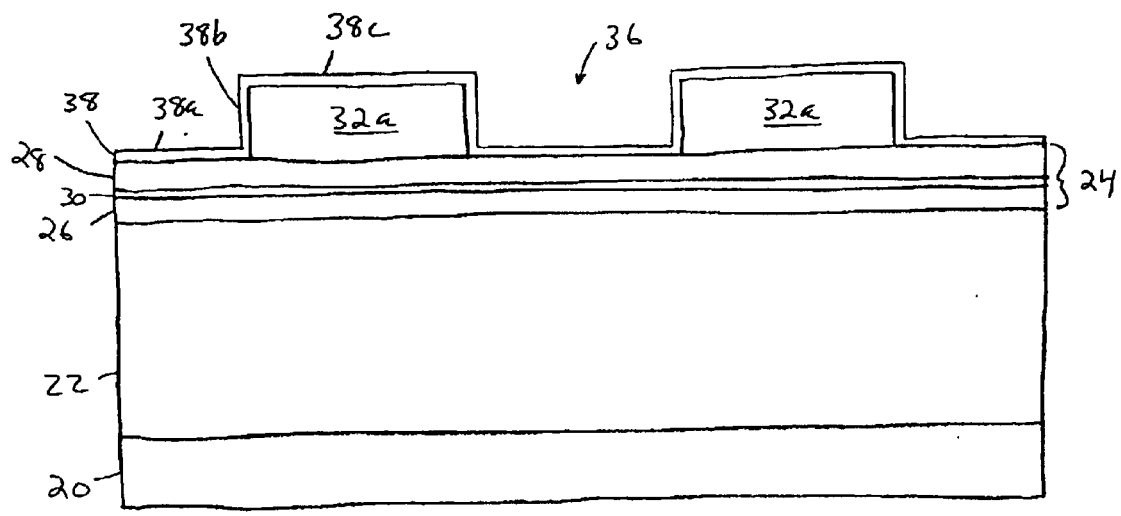
Figure 3:
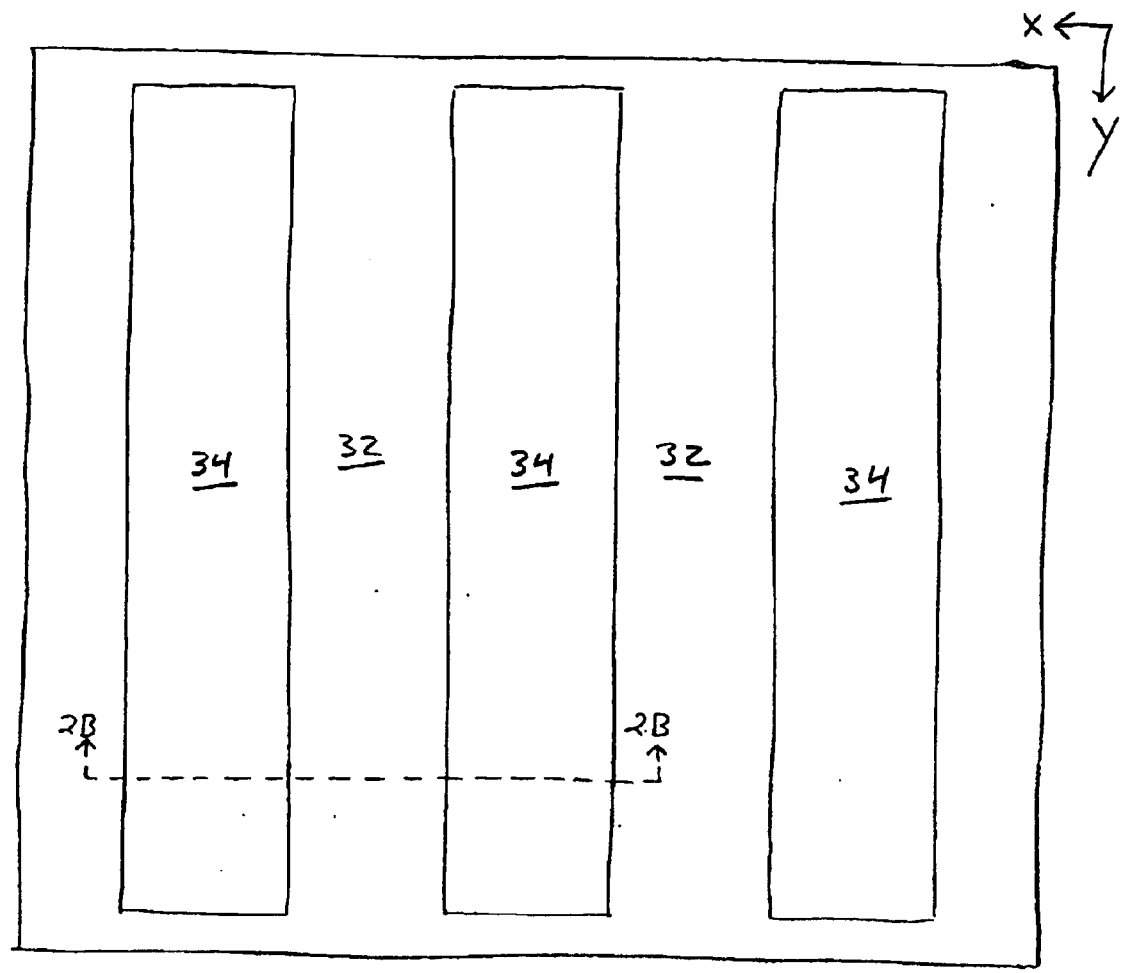
FIG. 3 is a top view illustrating the process of forming the etch mask and contact holes of the present invention.

Suitable photo resist material 34 is applied on the nitride layer 32 and a masking step is performed to selectively remove the photo resist except for stripes thereof that extend in the Y or column direction, as shown in FIG. 2B and from above in FIG. 3. Where the photo-resist material 34 is removed, the exposed nitride layer 32 is etched away using standard anisotropic etching techniques to form elongated blocks 32a of nitride interlaced with parallel trenches 36 therebetween that extend down to upper etch mask layer 28. After the photo resist material 34 is removed, a thin layer of material 38 (e.g. oxide with a 60–120 Å thickness) is then evenly formed over the structure using well known conformal deposition techniques, having first portions 38a horizontally extending along upper etch mask layer 28, second portions 38b vertically extending along the sidewalls of nitride blocks 32a, and third portions 38c horizontally extending along the tops of nitride blocks 32a. The resulting structure is shown in FIG. 2C.

Figure 2D:
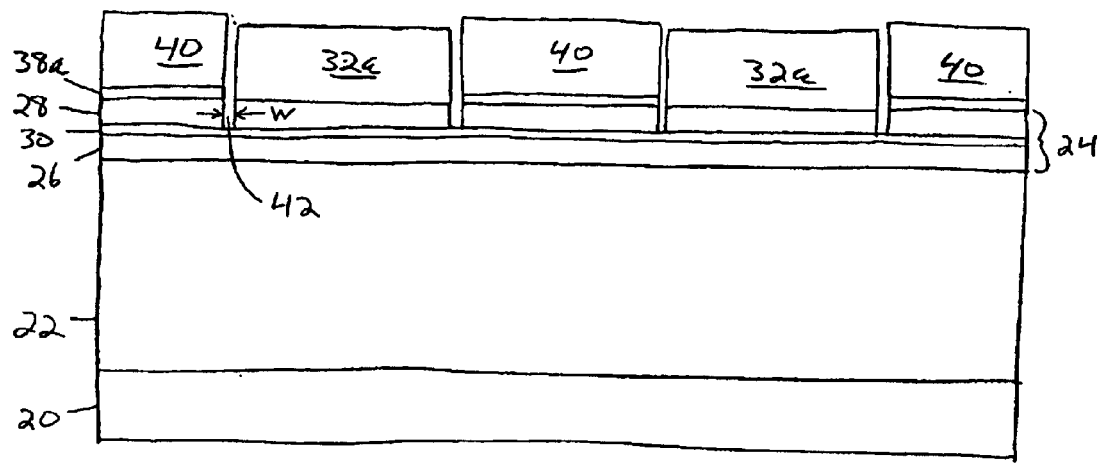

Another thick layer of material (e.g. nitride) is formed over the structure, followed by a chemical-mechanical polishing (CMP) etch using oxide layer portions 38c as an etch stop, which removes the nitride except for nitride blocks 40 that extend parallel to nitride blocks 32a (and are separated therefrom by oxide layer portions 38b). An oxide etch is then performed to remove oxide layer portions 38b and 38c, which exposes thin strips of upper etch mask layer 28 that were underneath the removed oxide layer portions 38b. An anisotropic amorphous silicon etch is then performed to remove those portions of upper etch mask layer 28 that were exposed by the removal of oxide layer portions 38b, which forms first (vertical) trenches 42 in upper etch mask layer 28 that extend down to and expose intermediate mask layer 30 and extend (vertically in the Y direction) along nitride blocks 32a/40. The resulting structure is shown in FIG. 2D. It is important the amorphous silicon etch is performed to etch upper etch mask layer 28 as vertically as possible (e.g.+/−1 degree), so that first trenches 42 have the same thickness W as oxide layer portions 38b.

Figure 2E:
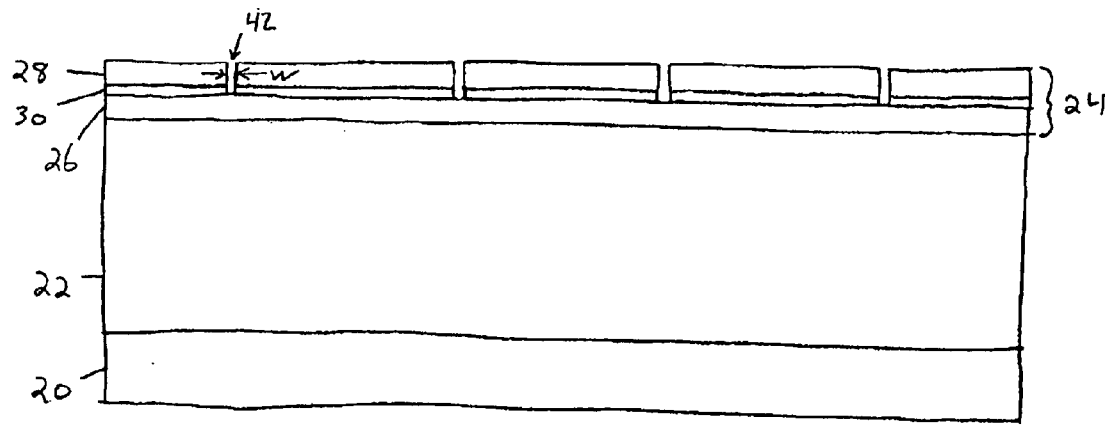

Nitride and oxide etches follow, which remove nitride blocks 32/40, oxide layer portions 38a, and the exposed portions of intermediate mask layer 30 at the bottom of first trenches to expose lower etch mask layer 26, as shown in FIG. 2E. At this point in the process, the etch mask 24 includes elongated first trenches 42 formed therein that extend down through upper etch mask layer 28 and intermediate mask layer 30 to expose lower etch mask layer 26.

Figure 4A:
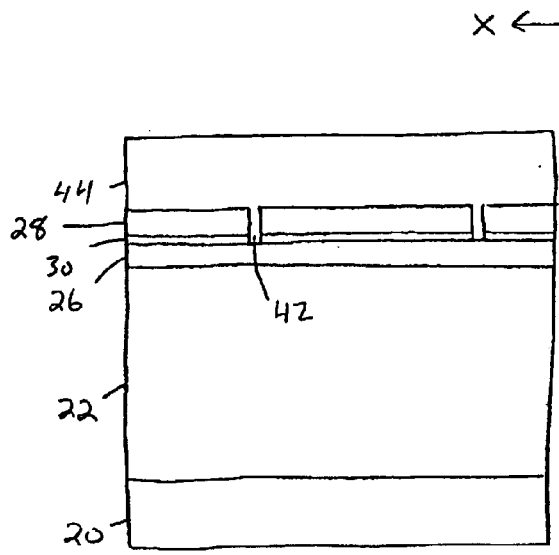
FIGS. 4A to 4E are cross-sectional views illustrating the process of forming the etch mask and contact holes of the present invention.
Figure 5A:
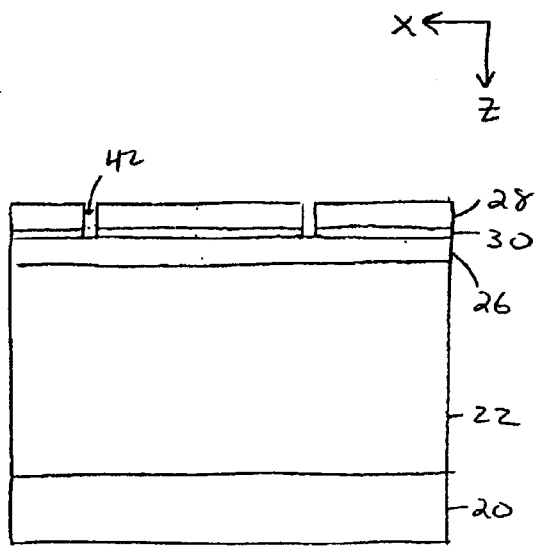
FIGS. 5A to 5E are cross-sectional views illustrating the process of forming the etch mask and contact holes of the present invention.

The processing steps described above with regard to FIGS. 2B to 2E and FIG. 3 are repeated, but with the masking step shown in FIGS. 2B and 3 performed in an orthogonal manner, as described below with respect to FIGS. 4A–4E, 5A–5E and 6A–6E. Specifically, a layer of material (e.g. nitride with about 600 Å thickness) is formed over the structure shown in FIG. 2E. Suitable photo resist material is applied on the nitride layer and a masking step is performed to selectively remove the photo resist except for stripes thereof that extend in the X or row direction. Where the photo-resist material is removed, the exposed nitride layer is etched away using standard anisotropic etching techniques to form elongated blocks 44 of the nitride material interlaced with parallel trenches 48 therebetween that extend down to upper etch mask layer 28. The photo resist is then removed, leaving the structure shown in FIGS. 4A, 5A and 6A. FIG. 4A is a cross sectional view of the structure (taken along line 4A in FIG. 6A) on which nitride blocks 44 are formed, and FIG. 5A is a cross sectional view of the structure (taken along line 5A in FIG. 6A) directly adjacent to where nitride blocks 44 are formed.

Figure 4B:
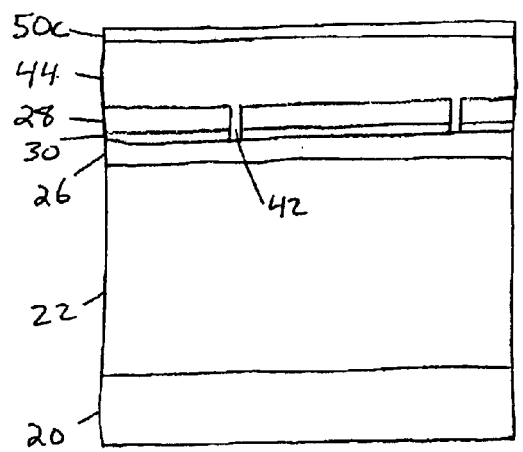
Figure 5B:
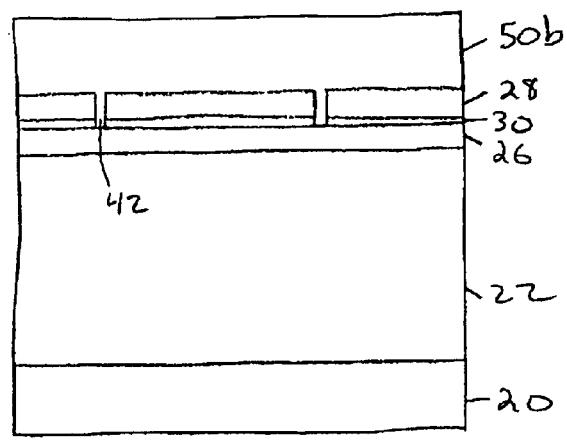
Figure 6A:
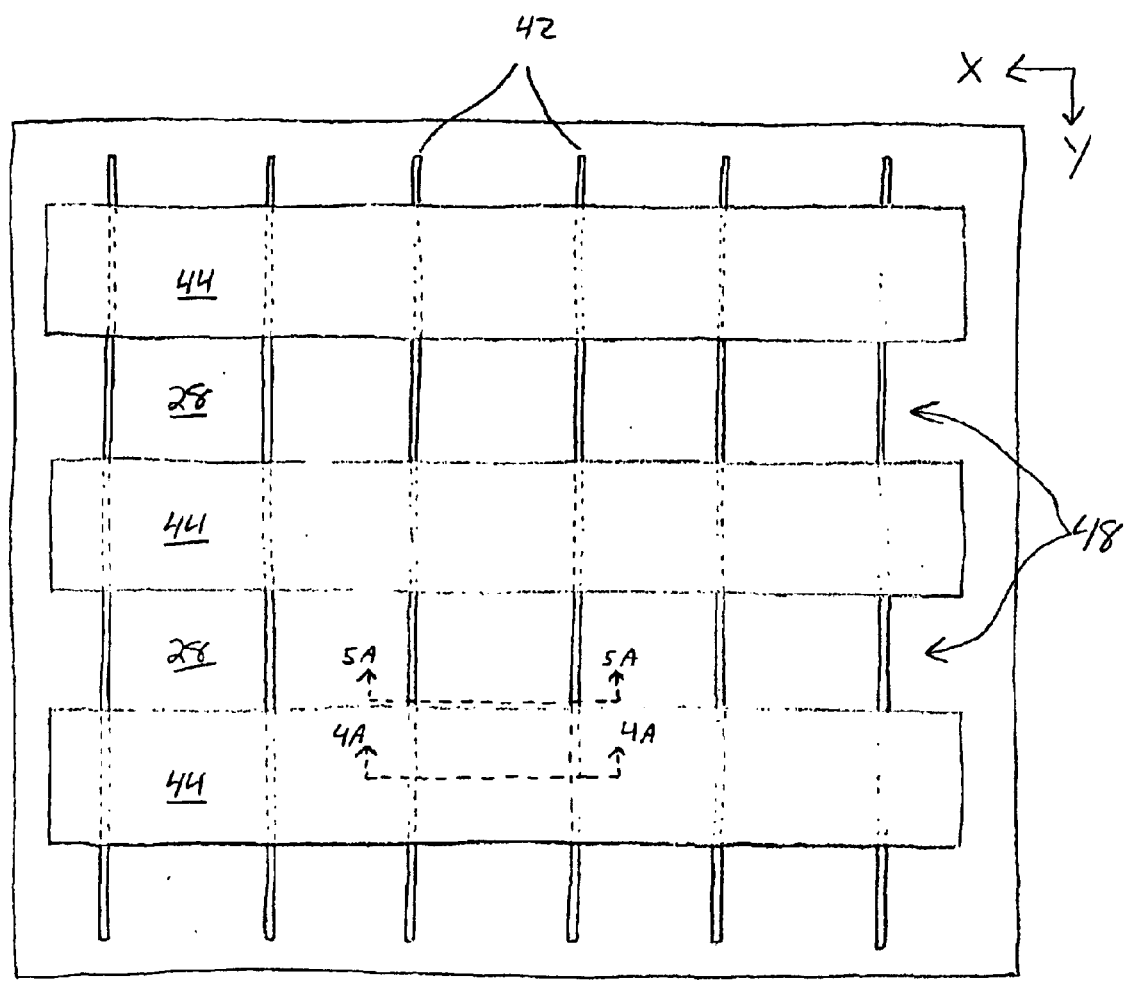
FIGS. 6A to 6E are top views illustrating the process of forming the etch mask and contact holes of the present invention.
Figure 6B:
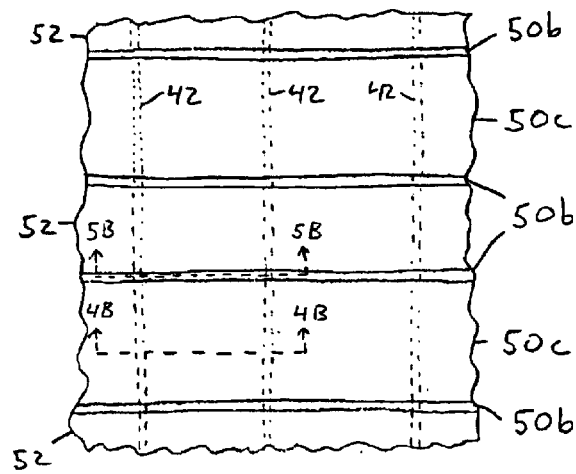

A thin layer of material 50 (e.g. oxide with a 60–120 Å thickness) is then evenly formed over the structure, having first portions (not shown) horizontally extending along upper etch mask layer 28 (i.e. bottom of trenches 48), second portions 50$b$ vertically extending along the sidewalls of nitride blocks 44, and third portions 50$c$ horizontally extending along the tops of nitride blocks 44. A thick layer of material (e.g. nitride) is formed over the structure, followed by a chemical-mechanical polishing (CMP) etch using oxide layer portions 50$c$ as an etch stop, which removes the nitride except for nitride blocks 52 that extend parallel to nitride blocks 44 (and are separated therefrom by oxide layer portions 50$b$). The resulting structure is shown in FIGS. 4B, 5B and 6B.

Figure 4C:
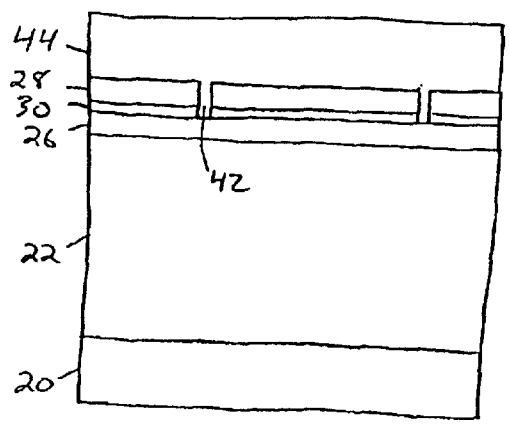
Figure 5C:
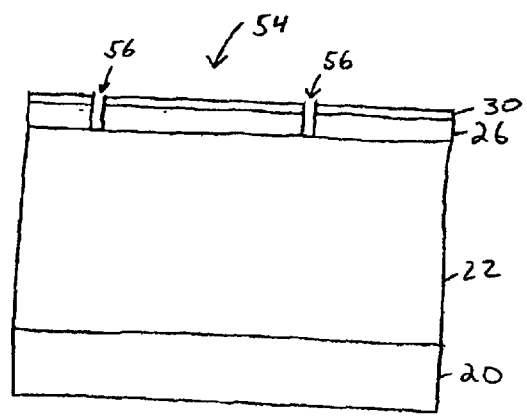
Figure 6C:
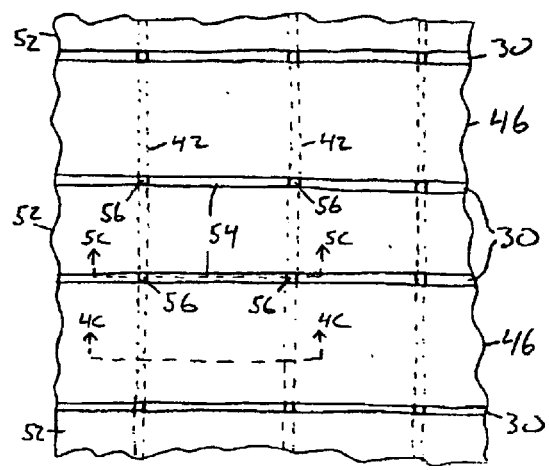

An oxide etch is next performed to remove oxide layer portions 50$b$ and 50$c$, which exposes thin strips of upper etch mask layer 28 that were underneath the removed oxide layer portions 50$b$. An amorphous silicon anisotropic etch is then performed to remove those portions of upper etch mask layer 28 that were exposed by the removal of oxide layer portions 50$b$, which forms second (horizontal) trenches 54 in upper etch mask layer 28 that extend down to and expose intermediate mask layer 30, and extend (horizontally in the X direction) along nitride blocks 44/52. This amorphous silicon etch also removes those portions of lower etch mask layer 26 which are exposed only where the first and second trenches 42/54 cross each other (intermediate mask layer 30 had previously been removed from first trenches 42), thus forming small through-holes 56 that extend entirely through etch mask 24 and expose small areas of ILD layer 22. The resulting structure is shown in FIGS. 4C, 5C and 6C. It is important the amorphous silicon etch is performed to etch upper and lower etch mask layers 28/26 as vertically as possible (e.g.+/−1 degree), so that through-holes 56 have the same width dimensions as the first and second trenches 42/54 through which the through-holes 56 are formed.

Figure 4D:
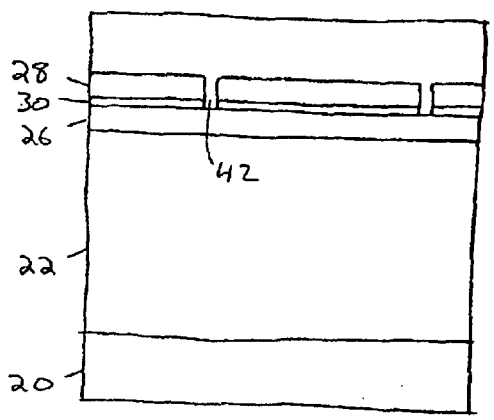
Figure 5D:
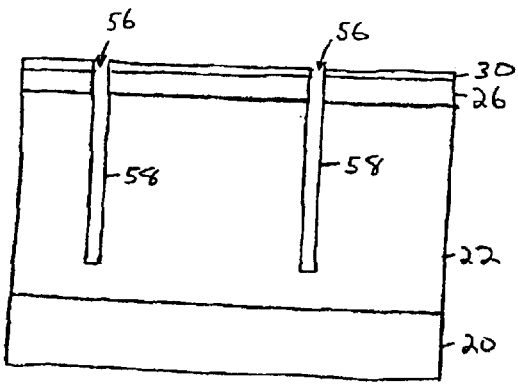
Figure 6D:
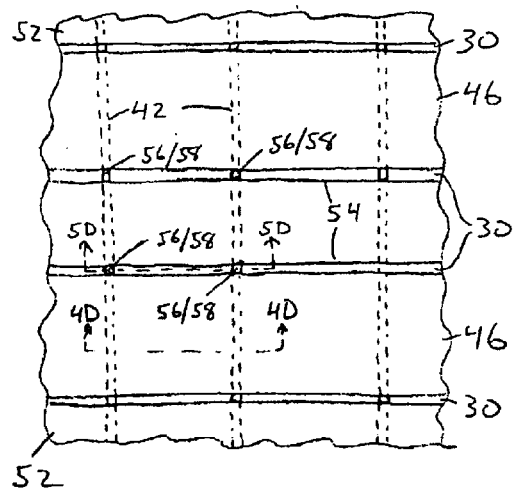

At this point in the process, the etch mask 24 has been completed, and the etching of contact holes into the ILD layer can commence. Specifically, the only exposed portions of ILD 22 that are exposed through all three etch mask layers (26/28/30) are those portions of ILD directly underneath the through-holes 56. At this time, an anisotropic ILD etch is performed using etch mask 24, where contact holes 58 are etched into the ILD layer 22 through the through-holes 56, as shown in FIGS. 4D, 5D, and 6D. Again, it is important the ILD etch be as vertical as possible, so that the contact holes 58 have the same cross-sectional size as the through-holes 56 through which contact hole 58 are formed. Contact holes 58 are preferably etched with a depth of about 1000–4000 Å.

Figure 5E:
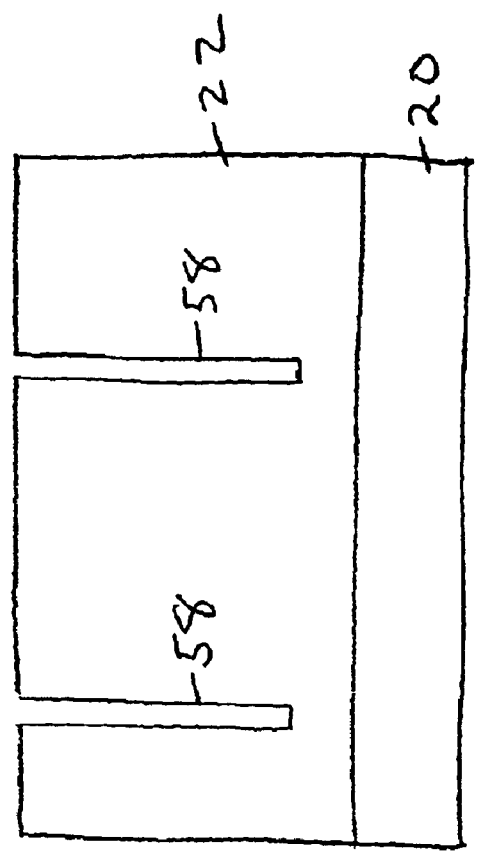
Figure 4E:
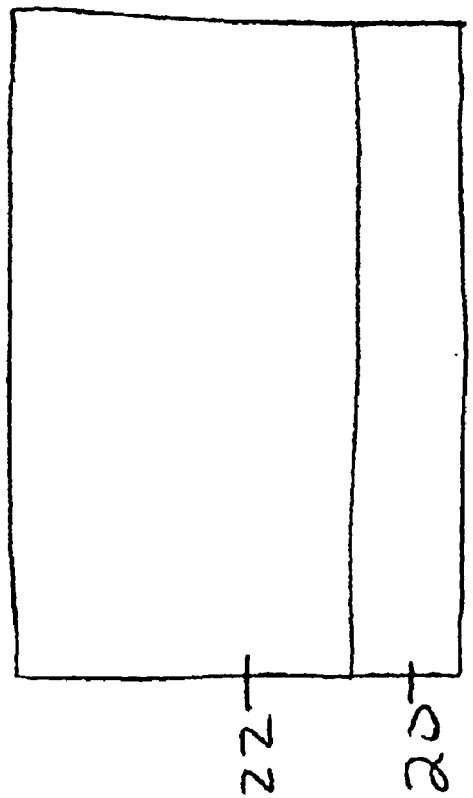
Figure 6E:
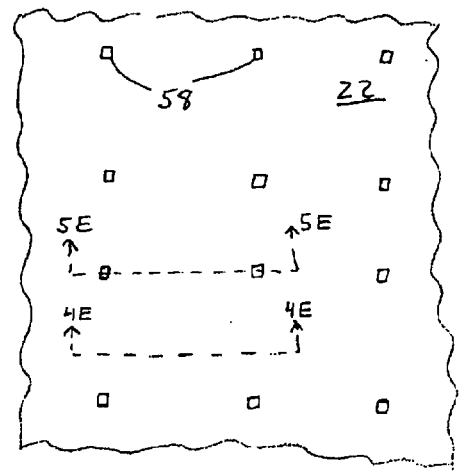

Finally, nitride, oxide and amorphous silicon etches follow, which remove the remaining portions of nitride blocks 44/52, oxide layer portions 50$a$, intermediate mask layer 30 and etch mask layer 26, resulting in the final structure shown in FIGS. 4E, 5E and 6E. It should be noted that nitride blocks 44/52 and remaining portions of oxide layer 50 could be removed before the formation of contact holes 58, as these material are not essential in the function of the completed etch mask 24.

The advantage of the present invention is that the dimensions of the contact holes 58 formed in insulation material 22 are defined by the resolution of material deposition processes, not by the resolution of the photo lithographic process used to make the structure. More specifically, the dimensions of contact holes 58 are dictated by the widths of intersected trenches 42/54 (and thus the sizes of through-holes 56), which in turn are dictated by the thicknesses of vertical layer portions 38$b$/50$b$ formed against blocks 40/52. Since material formation/deposition processes are far more controllable than photo lithographic processes, contact holes of much smaller dimension can be achieved by the method of the present invention, even when using two different photo lithographic exposures in the process. For example, using 0.06 micron photo lithographic processes that are currently available, features such as holes cannot be reliably made with dimensions less than about 600 nm. This process resolution in fact dictates the minimum achievable size of and spacing between nitride blocks 44 or 52 used to make nitride blocks 44/52 of the present invention. However, using the method of the present invention with material formation technology having a resolution of about 60 Å to 120 Å (+/−10 to 20 Å), contact holes 58 can be made with dimensions of about an order of magnitude less than that producible using 0.06 micron photo lithographic processes.

The use of an etch mask with an intermediate etch stop layer (i.e. layer 30) is advantageous because it ensure a greater manufacturing process window. Namely, the process does not rely on timed or other such processes that can product varying results. Instead, the intermediate layer provides a reliable etch stop to ensure that all of the vertical portion 38$b$ of layer 38 is removed, while this intermediate layer is then later easy to remove itself to allow the formation of the through-holes therethrough.

First Alternate Embodiment

FIGS. 7, 8A–8C and 9A–9C illustrate a first alternate embodiment of the present invention, which essentially employs the above described process except for a few minor differences. Specifically, the first alternate embodiment of the present invention starts with the same structure shown in FIG. 2A, except without the intermediate etch mask layer 30. Instead, upper etch mask layer 28 is formed directly on lower etch mask layer 26, provided that upper/lower etch mask layers 26/28 have high selective etch properties relative to each other. For example, upper etch mask layer 28 can be formed of amorphous silicon, and lower etch mask layer 26 can be formed of polysilicon. The processes described above with respect to FIGS. 2B to 2E are then performed on the structure formed without layer 30, which results in the structure shown in FIG. 7 (same as the structure in FIG. 2E except there is no intermediate etch mask layer 30, and lower/upper etch mask layers 26/28 have distinctive etch properties).

Figure 7:
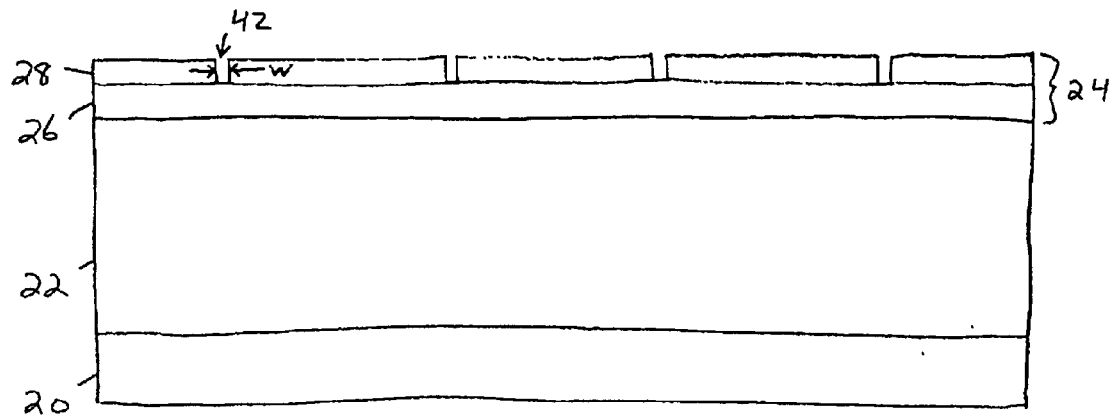
FIG. 7 is a cross-sectional view illustrating a first alternate embodiment of the process of forming the etch mask and contact holes of the present invention.
Figure 8A:
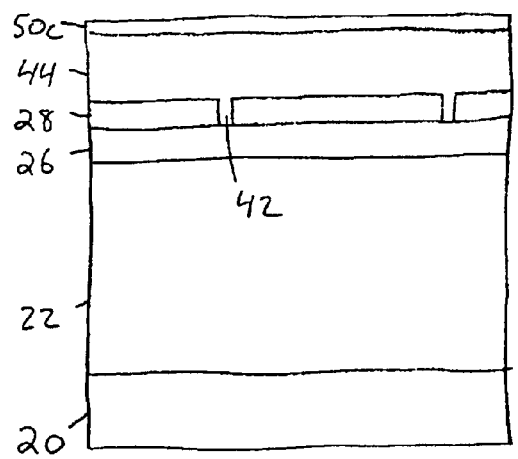
FIGS. 8A to 8C are cross-sectional views illustrating the first alternate embodiment of the process of forming the etch mask and contact holes of the present invention.
Figure 9A:
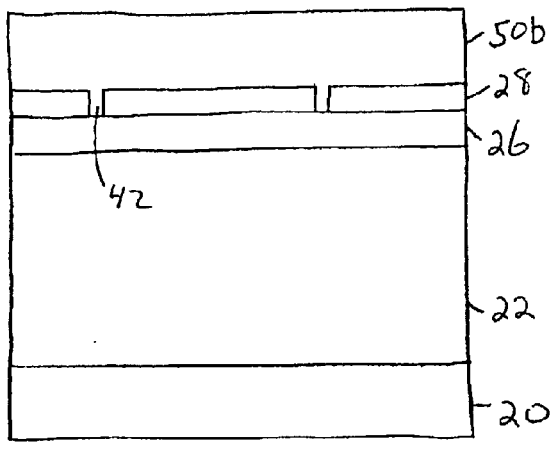
FIGS. 9A to 9C are cross-sectional views illustrating the first alternate embodiment of the process of forming the etch mask and contact holes of the present invention.

Next, the processing steps described above with respect to FIGS. 4A–4B and 5A–5B are performed on the structure of FIG. 7, resulting in the structure shown in FIGS. 8A and 9A.

Figure 8B:
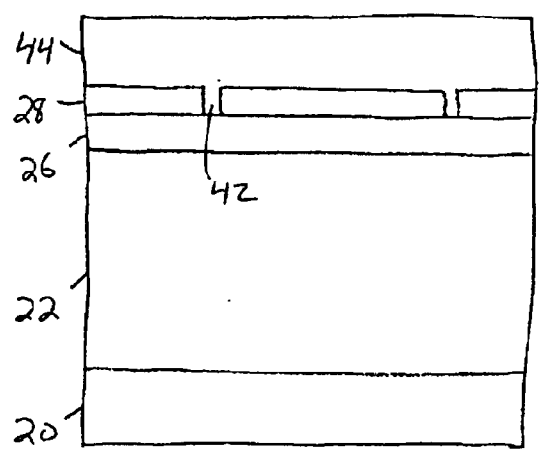
Figure 9B:
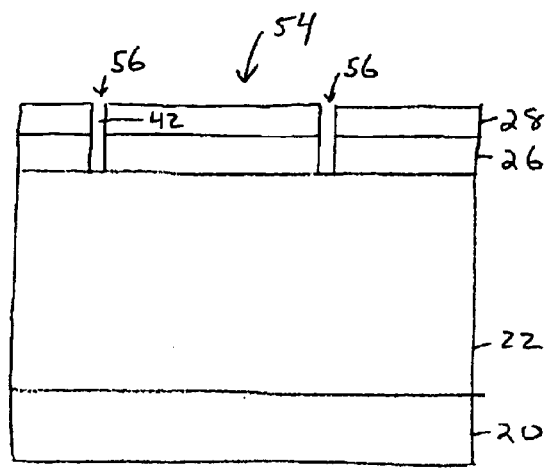
Figure 8C:
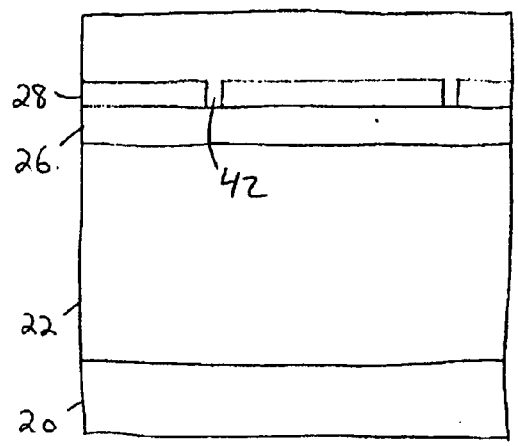
Figure 9C:
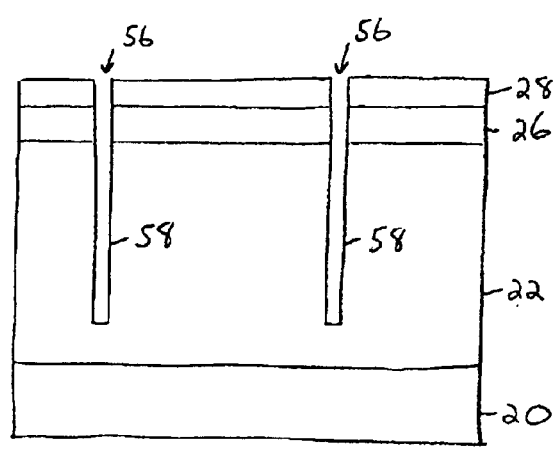

An oxide etch is next performed to remove oxide layer portions 50b and 50c, which forms the second (horizontal) trenches 54 between nitride blocks 44/52 and exposes thin strips of upper etch mask layer 28 that were underneath the removed oxide layer portions 50b. The oxide etch also removes the oxide layer portions 50b that fill first trenches 42 where first and second trenches 42/54 cross each other, thus exposing only those portions of lower etch mask layer 26 that are directly underneath the intersections of first/second trenches 42/54. An anisotropic poly etch is then used to remove those exposed portions of lower etch mask layer 26, forming through-holes 56 that extend through both upper and lower etch mask layers 26/28 and expose underlying portions of ILD 22, as shown in FIGS. 8B and 9B. At this point, the etch mask of the present invention is ready to form contact holes (via an anisotropic ILD etch through the through-holes 56 to form the contact holes 58), as shown in FIGS. 8C and 9C. The advantage of this first alternate embodiment is that there is no need to form (and later etch though) intermediate etch mask layer 30 for those applications in which this etch stop layer is deemed unnecessary.

Second Alternate Embodiment

FIGS. 10, 11A–11C and 12A–12C illustrate a second alternate embodiment of the present invention, which essentially employs the above described process with respect to the first alternate embodiment except for a few minor differences. Specifically, the second alternate embodiment of the present invention starts with the same structure shown in FIG. 2A, except without lower and intermediate etch mask layers 26/30. Instead, upper etch mask layer 28 is formed directly on ILD layer 22, provided that upper etch mask layer 28 and ILD layer 22 have high selective etch properties relative to each other. For example, upper etch mask layer 28 can be formed of amorphous silicon, which can be selectively etched compared to the ILD material. The processes described above with respect to FIGS. 2B to 2E are then performed on the structure formed without layers 26/30, which results in the structure shown in FIG. 10 (same as the structure in FIG. 2E except there are no lower and intermediate etch mask layers 26/30, and first trenches 42 extend down to and expose portions of the ILD material 22).

Figure 10:
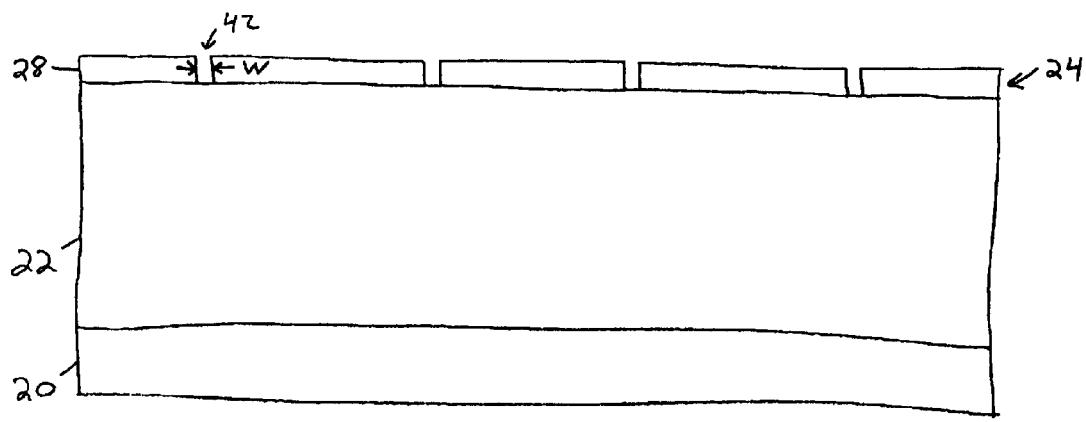
FIG. 10 is a cross-sectional view illustrating a second alternate embodiment of the process of forming the etch mask and contact holes of the present invention.
Figure 11A:
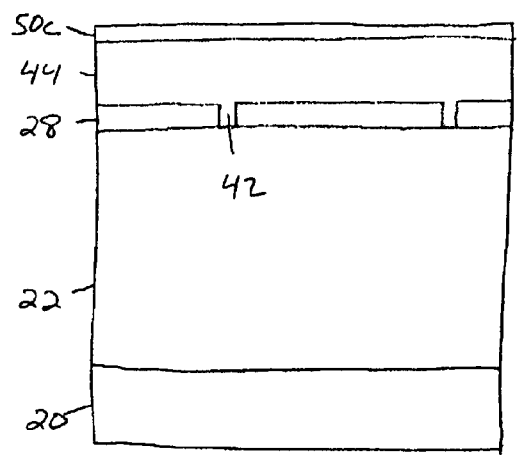
FIGS. 11A to 11C are cross-sectional views illustrating the second alternate embodiment of the process of forming the etch mask and contact holes of the present invention.
Figure 12A:
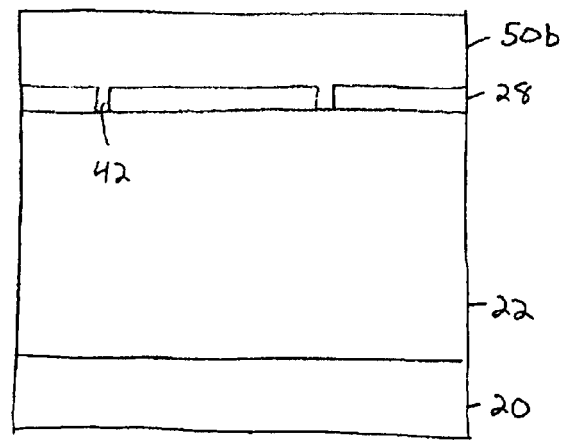
FIGS. 12A to 12C are cross-sectional views illustrating the second alternate embodiment of the process of forming the etch mask and contact holes of the present invention.
Figure 11B:
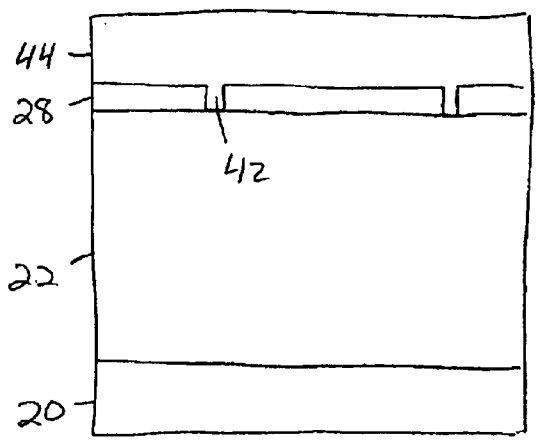
Figure 12B:
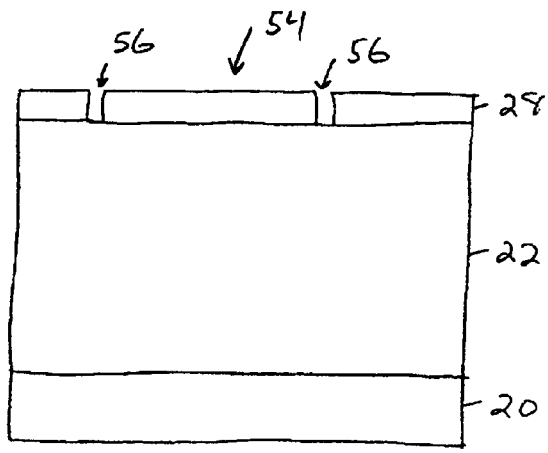
Figure 11C:
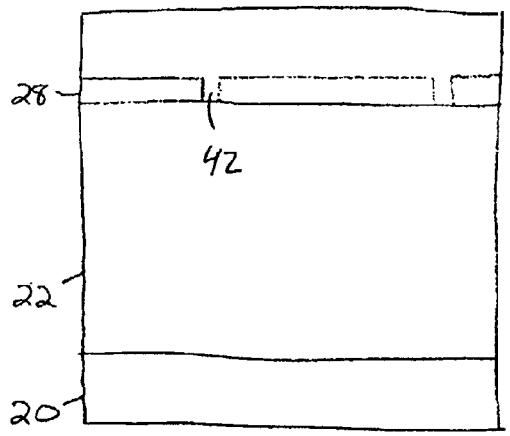
Figure 12C:
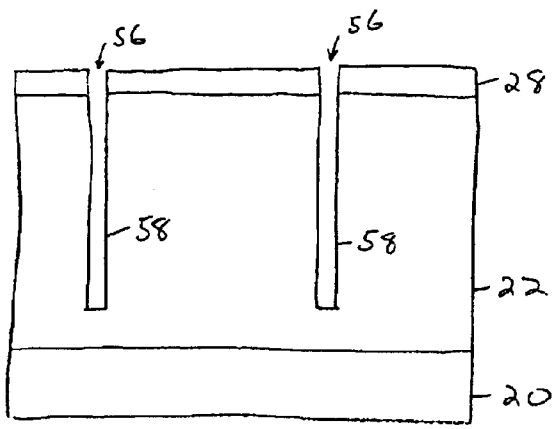

Next, the processing steps described above with respect to FIGS. 4A–4B and 5A–5B are performed on the structure of FIG. 10, resulting in the structure shown in FIGS. 11A and 12A. An oxide etch is next performed to remove oxide layer portions 50b and 50c, which forms the second (horizontal) trenches 54 between nitride blocks 44/52 and exposes thin strips of upper etch mask layer 28 that were underneath the removed oxide layer portions 50b. The oxide etch also removes the oxide layer portions 50b that fill first trenches 42 only where first and second trenches 42/54 cross each other, thus creating the through-holes 56 at those locations, and exposing only those portions of ILD layer 22 that are directly underneath the through-holes 56, as shown in FIGS. 11B and 12B. At this point, the etch mask of the present invention is ready to form contact holes (via an anisotropic ILD etch through the through-holes 56 to form the contact holes 58), as shown in FIGS. 11C and 12C.

The advantage of this second alternate embodiment is that the process is simplified, because there is no need to form (and later etch though) lower and intermediate etch mask layers 26 and 30.

It is to be understood that the present invention is not limited to the embodiment(s) described above and illustrated herein, but encompasses any and all variations falling within the scope of the appended claims. For example, while the present invention is ideal for forming contact holes in which phase change memory devices are formed, the method of forming contact holes according to the present invention can be used in any application requiring the formation of holes of very small dimension in semiconductor materials. Moreover, while the above description includes examples of materials and dimensions, any equivalent or appropriate materials and dimensions can be used so long as their etch properties and other performance parameters result in the formation of contact holes of the desired size using the process steps of the present invention. Further, as is apparent from the present disclosure and claims, not all method steps need be performed in the exact order illustrated or claimed, but rather in any order that allows for the proper formation of the etch mask and contact holes of the present invention. While first and second trenches 42/54 are shown as perpendicularly oriented, they need not be so long as they intersect each other. Lastly, single layers of certain material could be formed as multiple layers of materials, and vice versa.

What is claimed is:

1. A method of forming a contact hole in a semiconductor device, comprising:

forming a first material over a substantially horizontal surface of a semiconductor substrate;

forming an etch mask over the first material, wherein the etch mask includes at least a first trench and a second trench formed therein, and wherein a through-hole extends entirely through the etch mask where the first and second trenches intersect each other and exposes an area of the first material;

performing an etch process on the exposed area of the first material via the through-hole to form a contact hole in the first material.

2. The method of claim 1, wherein the contact hole has a cross-section size that substantially matches a cross-section size of the through-hole.

3. The method of claim 1, wherein the cross-section size of the through-hole is defined by a width of the first trench and a width of the second trench.

4. The method of claim 1, wherein the first and second trenches are substantially orthogonal to each other.

5. The method of claim 1, wherein the formation of the etch mask comprises:

forming the first trench in a first etch mask material; and forming the second trench in a second etch mask material disposed over the first etch mask material;

wherein the second trench extends over and exposes the first trench at the intersection of the first and second trenches to define the through-hole.

6. The method of claim 5, wherein:

the first etch mask material includes at least one layer of etch mask material; and the second etch mask material includes a pair of blocks of material having substantially vertical sidewalls facing each other.

7. The method of claim 1, wherein the formation of the etch mask comprises:

forming a first layer of material along a substantially vertical surface of the etch mask;

forming material along the first layer;

removing the first layer to form the first trench having a width substantially equal to a width of the first layer;

forming a second layer of material along a substantially vertical surface of the etch mask;

forming material along the second layer;

removing the second layer to form the second trench having a width substantially equal to a width of the second layer;

wherein the through-hole is defined by the intersection of the first and second trenches.

8. The method of claim 1, wherein the formation of the etch mask comprises:

forming an etch mask material over the first material;

forming a first block of material having a substantially vertical side surface over the etch mask material;

forming a first layer of material along the first block vertical side surface;

forming a second block of material along the first layer;

removing the first layer to form the first trench between the first and second blocks that exposes a first narrow strip portion of the etch mask material;

removing the exposed first narrow strip portion to extend the first trench down to the first material;

removing the first and second blocks;

forming a third block of material having a substantially vertical side surface over the etch mask material;

forming a second layer of material along the third block vertical side surface;

forming a fourth block of material along the second layer;

removing the second layer to form the second trench between the third and fourth blocks to expose a second narrow strip portion of the etch mask material and to form the through-hole which extends through the intersection of the first and second trenches.

9. The method of claim 8, wherein the second trench extends down to and terminates at the second narrow strip portion, except for a portion thereof which extends down to and terminates at the first material exposed area where the second narrow strip portion intersects with the first trench.

10. The method of claim 8, wherein the formation of the second layer includes forming a portion of the second layer in a portion of the first trench, and wherein the removal of the second layer includes removing at least some of the portion thereof in the first trench portion.

11. The method of claim 1, wherein the formation of the etch mask comprises:

forming a first etch mask layer over the first material;

forming a second etch mask layer over the first etch mask layer;

forming a first block of material having a substantially vertical side surface over the second etch mask layer;

forming a first layer of material along the first block vertical side surface;

forming a second block of material along the first layer;

removing the first layer to form the first trench between the first and second blocks that exposes a first narrow strip portion of the second etch mask layer;

removing the exposed first narrow strip portion to extend the first trench down to the first etch mask layer;

removing the first and second blocks;

forming a third block of material having a substantially vertical side surface over the second etch mask layer;

forming a second layer of material along the third block vertical side surface;

forming a fourth block of material along the second layer;

removing the second layer to form the second trench between the third and fourth blocks to expose a second narrow strip portion of the second etch mask layer and expose an area of the first etch mask layer underneath where the first and second trenches intersect; and removing the exposed area of the first etch mask layer to form the through-hole which extends through the intersection of the first and second trenches.

12. The method of claim 11, wherein the second trench extends down to and terminates at the second narrow strip portion, except for a portion thereof which extends down to and terminates at the exposed area of the first etch mask layer where the second narrow strip portion inter sects with the first trench.

13. The method of claim 11, wherein the formation of the second layer includes forming a portion of the second layer in a portion of the first trench, and wherein the removal of the second layer includes removing at least some of the portion thereof in the first trench portion.

14. The method of claim 11, wherein the removal of the first etch mask layer exposed area is performed using an etch process, and wherein first etch mask layer is selectively etch able relative to the second etch mask layer.

15. The method of claim 1, wherein the formation of the etch mask comprises:

forming a first etch mask layer over the first material;

forming an intermediate etch mask layer over the first etch mask layer;

forming a second etch mask layer over the intermediate etch mask layer;

forming a first block of material having a substantially vertical side surface over the second etch mask layer;

forming a first layer of material along the first block vertical side surface;

forming a second block of material along the first layer;

removing the first layer to form the first trench between the first and second blocks that exposes a first narrow strip portion of the second etch mask layer;

removing the exposed first narrow strip portion to extend the first trench down to and expose a second narrow strip portion of the intermediate etch mask layer;

removing the exposed second narrow strip portion to extend the first trench down to the first etch mask layer;

removing the first and second blocks;

forming a third block of material having a substantially vertical side surface over the second etch mask layer;

forming a second layer of material along the third block vertical side surface;

forming a fourth block of material along the second layer;

removing the second layer to form the second trench between the third and fourth blocks to expose a third narrow strip portion of the second etch mask layer and expose an area of the first etch mask layer underneath where the first and second trenches intersect; and removing the exposed area of the first etch mask layer to form the through-hole which extends through the intersection of the first and second trenches.

16. The method of claim 15, wherein the second trench extends down to and terminates at the third narrow strip portion, except for a portion thereof which extends down to and terminates at the exposed area of the first etch mask layer where the third narrow strip portion intersects with the first trench.

17. The method of claim 15, wherein the formation of the second layer includes forming a portion of the second layer in a portion of the first trench, and wherein the removal of the second layer includes removing at least some of the portion thereof in the first trench portion.

18. The method of claim 15, wherein the removal of the first etch mask layer exposed area is performed using an etch process, and wherein first and second etch mask layers are selectively etchable relative to the intermediate etch mask layer.

19. The method of claim 18, wherein first and second etch mask layers are formed of the same material.

20. A method of forming contact holes in a semiconductor device, comprising:
   forming a first material over a substantially horizontal surface of a semiconductor substrate;
   forming an etch mask over the first material, wherein the etch mask includes a plurality of first trenches and a plurality of second trenches formed therein, and wherein through-holes extend entirely through the etch mask where the first trenches intersect with the second trenches and expose areas of the first material;
   performing an etch process on the exposed areas of the first material via the through-holes to form contact holes in the first material.

21. The method of claim 20, wherein the contact holes have cross-section sizes that substantially match cross-section sizes of the through-holes.

22. The method of claim 20, wherein the cross-section sizes of the through-holes are defined by widths of the first trenches and widths of the second trenches.

23. The method of claim 20, wherein the first trenches are substantially orthogonal to the second trenches.

24. The method of claim 20, wherein the formation of the etch mask comprises:
   forming the first trenches in a first etch mask material; and
   forming the second trenches in a second etch mask material disposed over the first etch mask material;
   wherein the second trenches extend over and expose the first trenches at the intersections of the first and second trenches to define the through-holes.

25. The method of claim 24, wherein:
   the first etch mask material includes at least one layer of etch mask material; and
   the second etch mask material includes blocks of material having pairs of opposing and substantially vertical sidewalls.

26. The method of claim 20, wherein the formation of the etch mask comprises:
   forming a first layer of material along substantially vertical surfaces of the etch mask;
   forming material along the first layer;
   removing the first layer to form the first trenches having a width substantially equal to a width of the first layer;
   forming a second layer of material along substantially vertical surfaces of the etch mask;
   forming material along the second layer;
   removing the second layer to form the second trenches having a width substantially equal to a width of the second layer;
   wherein the through-holes are defined by the intersections of the first trenches with the second trenches.

27. The method of claim 20, wherein the formation of the etch mask comprises:
   forming an etch mask material over the first material;
   forming first blocks of material having substantially vertical side surfaces over the etch mask material;
   forming a first layer of material along the first block vertical side surfaces;
   forming second blocks of material along the first layer;
   removing the first layer to form the first trenches between the first and second blocks that exposes first narrow strip portions of the etch mask material;
   removing the exposed first narrow strip portions to extend the first trenches down to the first material;
   removing the first and second blocks;
   forming third blocks of material having substantially vertical side surfaces over the etch mask material;
   forming a second layer of material along the third block vertical side surfaces;
   forming fourth blocks of material along the second layer;
   removing the second layer to form the second trenches between the third and fourth blocks to expose second narrow strip portions of the etch mask material and to form the through-holes which extend through the intersections of the first and second trenches.

28. The method of claim 27, wherein the second trenches extend down to and terminate at the second narrow strip portions, except for portions thereof which extend down to and terminate at the first material exposed areas where the second narrow strip portions intersect with the first trenches.

29. The method of claim 27, wherein the formation of the second layer includes forming portions of the second layer in portions of the first trenches, and wherein the removal of the second layer includes removing at least some of the portions thereof in the first trench portions.

30. The method of claim 20, wherein the formation of the etch mask comprises:
   forming a first etch mask layer over the first material;
   forming a second etch mask layer over the first etch mask layer;
   forming first blocks of material having substantially vertical side surfaces over the second etch mask layer;
   forming a first layer of material along the first block vertical side surfaces;
   forming second blocks of material along the first layer;
   removing the first layer to form the first trenches between the first and second blocks that expose first narrow strip portions of the second etch mask layer;
   removing the exposed first narrow strip portions to extend the first trenches down to the first etch mask layer;
   removing the first and second blocks;
   forming third blocks of material having substantially vertical side surfaces over the second etch mask layer;
   forming a second layer of material along the third block vertical side surfaces;
   forming fourth blocks of material along the second layer;
   removing the second layer to form the second trenches between the third and fourth blocks to expose second narrow strip portions of the second etch mask layer and expose areas of the first etch mask layer underneath where the first and second trenches intersect; and
   removing the exposed areas of the first etch mask layer to form the through-holes which extend through the intersections of the first trenches with the second trenches.

31. The method of claim 30, wherein the second trenches extend down to and terminate at the second narrow strip portions, except for portions thereof which extend down to and terminate at the exposed areas of the first etch mask layer where the second narrow strip portions intersect with the first trenches.

32. The method of claim 30, wherein the formation of the second layer includes forming a portion of the second layer in portions of the first trenches, and wherein the removal of the second layer includes removing at least some of the portions thereof in the first trench portions.

33. The method of claim 30, wherein the removal of the first etch mask layer exposed areas are performed using an etch process, and wherein first etch mask layer is selectively etchable relative to the second etch mask layer.

34. The method of claim 20, wherein the formation of the etch mask comprises:

forming a first etch mask layer over the first material;

forming an intermediate etch mask layer over the first etch mask layer;

forming a second etch mask layer over the intermediate etch mask layer;

forming first blocks of material having substantially vertical side surfaces over the second etch mask layer;

forming a first layer of material along the first block vertical side surfaces;

forming second blocks of material along the first layer;

removing the first layer to form the first trenches between the first and second blocks that expose first narrow strip portions of the second etch mask layer;

removing the exposed first narrow strip portions to extend the first trenches down to and expose second narrow strip portions of the intermediate etch mask layer;

removing the exposed second narrow strip portions to extend the first trenches down to the first etch mask layer;

removing the first and second blocks;

forming third blocks of material having substantially vertical side surfaces over the second etch mask layer;

forming a second layer of material along the third block vertical side surfaces;

forming fourth blocks of material along the second layer;

removing the second layer to form the second trenches between the third and fourth blocks to expose third narrow strip portions of the second etch mask layer and expose areas of the first etch mask layer underneath where the first trenches intersect with the second trenches; and removing the exposed areas of the first etch mask layer to form the through-holes which extend through the intersections of the first and second trenches.

35. The method of claim 34, wherein the second trenches extend down to and terminate at the third narrow strip portions, except for portions thereof which extend down to and terminate at the exposed areas of the first etch mask layer where the third narrow strip portions intersect with the first trenches.

36. The method of claim 34, wherein the formation of the second layer includes forming portions of the second layer in portions of the first trenches, and wherein the removal of the second layer includes removing at least some of the portions thereof in the first trench portions.

37. The method of claim 34, wherein the removal of the first etch mask layer exposed areas is performed using an etch process, and wherein first and second etch mask layers are selectively etchable relative to the intermediate etch mask layer.

38. The method of claim 37, wherein first and second etch mask layers are formed of the same material.

* * * * *